(12) United States Patent
Luo et al.

(10) Patent No.: US 10,978,421 B2
(45) Date of Patent: Apr. 13, 2021

(54) WAFER-LEVEL PACKAGING METHOD AND PACKAGE STRUCTURE

(71) Applicant: Ningbo Semiconductor International Corporation, Ningbo (CN)

(72) Inventors: Hailong Luo, Ningbo (CN); Clifford Ian Drowley, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/228,167

(22) Filed: Dec. 20, 2018

(65) Prior Publication Data

US 2020/0075537 A1 Mar. 5, 2020

Related U.S. Application Data

(63) Continuation of application No. PCT/CN2018/113099, filed on Oct. 31, 2018.

(30) Foreign Application Priority Data

Sep. 4, 2018 (CN) .......................... 201811028259.1

(51) Int. Cl.
*H01L 23/00* (2006.01)
*H01L 21/56* (2006.01)
*H01L 23/31* (2006.01)
*H01L 23/552* (2006.01)
*H01L 25/065* (2006.01)
*H01L 25/00* (2006.01)
*H01L 25/07* (2006.01)
(Continued)

(52) U.S. Cl.
CPC ............ *H01L 24/94* (2013.01); *H01L 21/561* (2013.01); *H01L 21/565* (2013.01);
(Continued)

(58) Field of Classification Search
CPC . H01L 24/94; H01L 25/06952; H01L 25/071; H01L 25/112; H01L 23/552;
(Continued)

(56) References Cited

U.S. PATENT DOCUMENTS 7,196,275 B2 * 3/2007 Babb ..................... H01L 23/552
174/377
7,445,968 B2 * 11/2008 Harrison ............. H01L 23/3677
257/660

(Continued)

FOREIGN PATENT DOCUMENTS

CN 101932223 A 12/2010
CN 103708407 A 4/2014
(Continued)

*Primary Examiner* — David A Zarneke
(74) *Attorney, Agent, or Firm* — Anova Law Group, PLLC

(57) ABSTRACT

The present disclosure provides a wafer level packaging method and a package structure. The wafer level packaging method includes: forming a bonding structure including a device wafer and a plurality of first chips bonded to the device wafer; conformally covering the plurality of first chips and the device wafer exposed by the plurality of first chips with an insulating layer; conformally covering the insulating layer with a shielding layer; and forming an encapsulation layer on the shielding layer. The wafer level package structure includes: a device wafer; a plurality of first chips bonded to the device wafer; an insulating layer conformally covering the plurality of first chips and the device wafer exposed by the plurality of first chips; a shielding layer conformally covering the insulating layer; and an encapsulation layer formed on the shielding layer. The wafer level package structure provides a reduced volume and a reduced thickness.

20 Claims, 4 Drawing Sheets

(51) Int. Cl.
*H01L 25/11* (2006.01)
*H01L 25/16* (2006.01)

(52) U.S. Cl.
CPC ........ *H01L 23/3135* (2013.01); *H01L 23/552* (2013.01); *H01L 24/08* (2013.01); *H01L 24/80* (2013.01); *H01L 25/0652* (2013.01); *H01L 25/50* (2013.01); *H01L 25/071* (2013.01); *H01L 25/112* (2013.01); *H01L 25/162* (2013.01); *H01L 2224/08145* (2013.01); *H01L 2224/80894* (2013.01); *H01L 2225/06524* (2013.01); *H01L 2225/06537* (2013.01); *H01L 2225/06582* (2013.01); *H01L 2924/3025* (2013.01)

(58) Field of Classification Search
CPC ..... H01L 23/56; H01L 23/5225; H01L 25/50; H01L 25/162; H01L 2225/06537; H01L 2225/06562
See application file for complete search history.

(56) References Cited

U.S. PATENT DOCUMENTS

| | | | | |
|---|---|---|---|---|
| 7,687,895 B2 * | 3/2010 | Brunnbauer | ......... | H01L 21/561 257/685 |
| 7,701,040 B2 * | 4/2010 | Huang | ......... | H01L 21/561 257/659 |
| 7,752,751 B2 * | 7/2010 | Kapusta | ......... | C23C 14/046 29/846 |
| 8,007,853 B2 * | 8/2011 | Bydlon | ......... | A61K 45/06 424/523 |
| 8,115,117 B2 * | 2/2012 | Kapusta | ......... | H05K 9/0024 174/386 |
| 8,258,012 B2 * | 9/2012 | Pagaila | ......... | H01L 21/561 438/113 |
| 8,276,268 B2 * | 10/2012 | Kapusta | ......... | H05K 1/0218 29/832 |
| 8,309,454 B2 * | 11/2012 | Brunnbauer | ......... | H01L 21/561 257/660 |
| 9,620,463 B2 * | 4/2017 | Kim | ......... | H01L 24/19 |
| 10,224,290 B2 * | 3/2019 | Dias | ......... | H01L 23/552 |
| 10,242,957 B2 * | 3/2019 | Kim | ......... | H01L 23/3114 |
| 10,418,341 B2 * | 9/2019 | Jung | ......... | H01L 23/49838 |
| 10,468,379 B1 * | 11/2019 | Liu | ......... | H01L 25/0652 |
| 10,756,051 B2 * | 8/2020 | Luo | ......... | H01L 24/95 |
| 2015/0287697 A1 * | 10/2015 | Tsai | ......... | H01L 21/4853 257/770 |
| 2018/0090448 A1 * | 3/2018 | Kim | ......... | H01L 24/48 |

FOREIGN PATENT DOCUMENTS

| | | |
|---|---|---|
| CN | 106952833 A | 7/2017 |
| CN | 107408551 A | 11/2017 |

* cited by examiner

WAFER-LEVEL PACKAGING METHOD AND PACKAGE STRUCTURE

CROSS-REFERENCES TO RELATED APPLICATIONS

This application is a continuation application of PCT Patent Application No. PCT/CN2018/113099, filed on Oct. 31, 2018, which claims priority to Chinese patent application No. 201811028259.1, filed on Sep. 4, 2018, the entirety of all of which is incorporated herein by reference.

FIELD OF THE DISCLOSURE

The present disclosure relates to the field of semiconductor technologies and, in particular, to a wafer level packaging method and a package structure.

BACKGROUND

With the development of ultra-large scale integrated circuits, the feature size of integrated circuits continues to decrease, and the requirements for packaging technology of integrated circuits are correspondingly increasing. Existing packaging technologies involve ball grid array (BGA), chip scale package (CSP), wafer level package (WLP), 3D package (3D) and system in package (SiP), etc.

At present, to meet the goal for lower cost, more reliable, faster and higher density of integrated circuit packaging, advanced packaging methods mainly use wafer-level system-in-package (WLSiP). Compared with the conventional SiP, the WLSiP completes the package integration process on a wafer, which has the advantages of greatly reducing the area of the package structure, reducing the manufacturing cost, optimizing the electrical performance, batch manufacturing, etc., therefore can significantly reduce workload and needs for equipments.

The integrated circuits are susceptible to external magnetic fields during use, resulting in insufficient stability. The prior art reduces the interference of the external magnetic fields by providing a shielding structure in the integrated circuit, but the integrated circuit with the shielding structure has a problem of a large volume and a large thickness.

BRIEF SUMMARY OF THE DISCLOSURE

One aspect of the present disclosure provides a wafer level packaging method, including: forming a bonding structure, the bonding structure including a device wafer and a plurality of first chips bonded to the device wafer; conformally covering the plurality of first chips and the device wafer exposed by the plurality of first chips with an insulating layer; conformally covering the insulating layer with a shielding layer; and forming an encapsulation layer on the shielding layer.

Another aspect of the present disclosure provides a wafer level package structure, including: a device wafer; a plurality of first chips, bonded to the device wafer; an insulating layer, conformally covering the plurality of first chips and the device wafer exposed by the plurality of first chips; a shielding layer, conformally covering the insulating layer; and an encapsulation layer, formed on the shielding layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Semiconductor packaging methods and structures are often complicated. For example, after a bare chip to be integrated is bonded to a wafer, a first connection structure is needed to be connected to the chip, a second connection structure is needed to be connected to a chip in the wafer, and an interconnection structure is needed to be connected to the first connection structure and the second connection structure.

The present disclosure provides a wafer level packaging method and a wafer level package structure having a reduced volume and a reduced thickness.

An exemplary wafer level packaging method, includes: forming a bonding structure, the bonding structure including a device wafer and a plurality of first chips bonded to the device wafer; conformally covering the plurality of first chips and the device wafer exposed by the plurality of first chips with an insulating layer; conformally covering the insulating layer with a shielding layer; and forming an encapsulation layer on the shielding layer. The formed wafer level package structure provides a reduced volume and a reduced thickness.

The insulating layer conformally covers the plurality of first chips and the device wafer exposed by the plurality of first chips. The shielding layer conformally covers the insulating layer. Providing the shielding layer on the bonding structure can reduce the influence of external magnetic fields on the plurality of first chips. Further, the insulating layer may be used to isolate the shielding layer from the plurality of first chips and the device wafer; thereby avoiding the influence of the shielding layer on the plurality of first chips and the device wafer. The insulating layer and the shielding layer are formed to conformally cover on the bonding structure without excessively increasing the volume and the thickness of the package structure. As such, while maintaining a small volume and a small thickness, the packaging structure is not susceptible to external magnetic fields.

To make the above described objects, features and advantages of the present disclosure easier to be understood, exemplary embodiments of the present disclosure are described in detail below with reference to the accompanying drawings.

FIGS. 1-4 illustrate schematic cross-sectional views of structures corresponding to certain stages during an exemplary wafer level packaging method according to some embodiments of the present disclosure.

Figure 1:
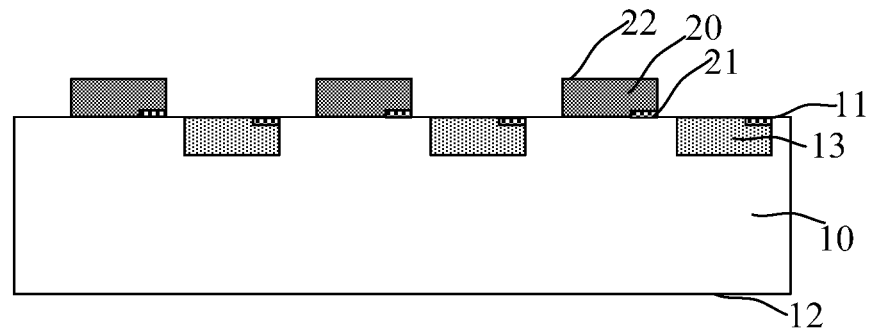
FIGS. 1-4 and 4A illustrate schematic cross-sectional views of structures corresponding to certain stages during an exemplary wafer level packaging method according to some embodiments of the present disclosure.

As shown in FIG. 1, a bonding structure is formed. The bonding structure includes a device wafer 10 and a plurality of first chips 20 bonded to the device wafer 10.

The device wafer 10 is a wafer to be packaged that has been formed with devices. In some embodiments, the semiconductor substrate of the device wafer 10 is a silicon substrate. In other embodiments, the semiconductor substrate may be made by other materials, such as germanium, silicon germanium, silicon carbide, gallium arsenide, and/or indium gallium. In other embodiments, the semiconductor substrate can also be other types of substrates such as a silicon substrate on an insulator and a germanium substrate on an insulator. The material of the semiconductor substrate may be a material suitable for the needs of the semiconductor process or may be easy to integrate. The device wafer 10 has a thickness of about 10 micrometers to about 100 micrometers according to actual process requirements.

A plurality of second chips 13 has been formed in the device wafer 10. In one embodiment, the plurality of second chips 13 formed in the device wafer 10 may be the same type or different types. The device wafer 10 can be fabricated by using an integrated circuit fabrication technique. For example, devices, such as N-Metal-Oxide-Semiconductor (NMOS) devices and P-Metal-Oxide-Semiconductor (PMOS) devices, may be formed on a first semiconductor substrate by processes such as a deposition, an etching, etc., such that at least one of the plurality of second chips 13 is integrated in the device wafer 10.

For example, a surface of the device wafer 10 on which the plurality of second chips 13 is formed is a wafer front surface 11, and a surface opposite to the wafer front surface 11 is a wafer back surface 12. The plurality of first chips 20 is bonded to the wafer front surface 11 of the device wafer 10.

The plurality of first chips 20 is used as chips to be integrated in a wafer-level system-in-package (WLSiP).

The wafer level system packaging method according to one embodiment of the present disclosure is used to achieve heterogeneous integration. Correspondingly, the plurality of first chips 20 may be chips made of silicon wafers, or may be chips formed of other materials.

The number of the plurality of first chips 20 is at least one. When the number of the plurality of first chips 20 is two or more, the functions of the plurality of first chips 20 are different. The plurality of first chips 20 can be fabricated by using an integrated circuit fabrication technology, and can be memory chips, communication chips, processors, or logic chips. The plurality of first chips 20 includes devices such as NMOS devices or PMOS devices formed on a semiconductor substrate.

For example, lead pads are formed in the plurality of first chips 20, to implement electrical connection of the plurality of first chips 20. A surface of the plurality of first chips 20 adjacent to the lead pads is a chip front surface 21, and a surface opposite to the chip front surface 21 is a chip back surface 22. In one embodiment, the chip front surface 21 of the plurality of first chips 20 is bonded to the wafer front surface 11 of the device wafer 10.

For example, a bonding of the plurality of first chips 20 and the device wafer 10 may be achieved by a fusion bonding, an adhesive bonding, a glass dielectric bonding, etc.

A fusion bonding is a process of performing bonding mainly by using interface chemistry. In the fusion bonding, surface activity of a first oxide layer and a second oxide layer is increased, a covalent bond is formed between contact surfaces of the first oxide layer and the second oxide layer, and a bonding is formed in a form of the covalent bond, thereby improving package reliability between the plurality of first chips 20 and the device wafer 10.

An adhesive bonding has a low bonding temperature and is compatible with CMOS devices. A wafer is adhesive-bonded in a heterogeneous integration process. For example, the adhesive bonding process includes: forming a binder on bonding surfaces of chips and a wafer, that the binder is usually a polymer; leaving the binder unpolymerized or partially polymerized by soft baking or pre-curing the polymer; and bringing the bonding surfaces of the chips and the wafer into contact after the chips and the wafer are placed in a chamber and the chamber is vacuumed. The surfaces to be bonded are then tightly bonded by applying pressure.

A glass dielectric bonding refers to printing glass solder on a wafer to form closed loops, and then placing the printed wafer in a reflow oven for pre-sintering. The pre-sintered wafer is placed in alignment with chips, and the chips are placed in the closed loops. The pre-sintered wafer and the chips are then placed in a bonding machine for sintering to form sealed cavities. The glass dielectric bonding process is simple, has high bonding strength, has good sealing effect, and is especially suitable for mass production.

In one embodiment, the plurality of first chips 20 bonded to the device wafer 10 and the plurality of second chips 13 formed in the device wafer 10 are staggered from each other, that is, the projection of the plurality of first chips 20 on the device wafer 10 does not coincide with the plurality of second chips 13. Therefore when an insulating layer and a shielding layer conformally cover the bonding structure sequentially, the insulating layer and the shielding layer can also cover the plurality of second chips 13, thereby shielding the plurality of second chips 13.

In other embodiments, a plurality of first chips bonded to the device wafer and a plurality of second chips formed in the device wafer may also be aligned with each other. That is, the projection of the plurality of first chips on the device wafer coincides with the plurality of second chips. When an insulating layer and a shielding layer conformally cover the bonding structure, the insulating layer and the shielding layer cover the plurality of first chips, and the shielding effect can also be good.

Figure 2:
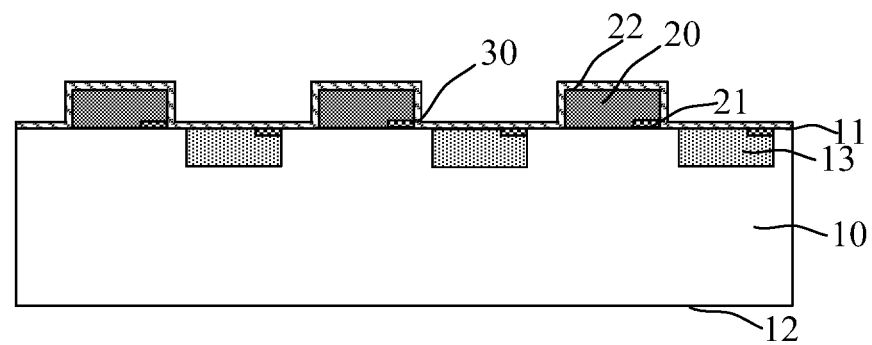

As shown in FIG. 2, an insulating layer 30 conformally covers the plurality of first chips 20 and the device wafer 10 exposed by the plurality of first chips 20.

It should be noted that a shielding layer 40 (shown in FIG. 3) is usually a conductive material, to reduce interference of external magnetic fields. The insulating layer 30 is used to achieve electrical insulation between the shielding layer 40 and the plurality of first chips 20, and between the shielding layer 40 and the device wafer 10, thereby avoiding influence of the shielding layer 40 on the electrical performance of the package structure.

In one embodiment, the insulating layer 30 covers the chip back surface 22 of the plurality of first chips 20 and the wafer front surface 11 of the device wafer 10.

In one embodiment, the insulating layer 30 conformally covers the plurality of first chips 20 and the device wafer 10 exposed by the plurality of first chips 20. The thickness of the insulating layer 30 is relatively small, which is advantageous for reducing the thickness and the volume of the package structure.

It should be noted that if the thickness of the insulating layer 30 is too large, the thickness and the volume of the formed package structure are easily increased; and if the thickness of the insulating layer 30 is too small, the insulating effect of the insulating layer 30 is easily affected. Optionally, the insulating layer 30 has a thickness in a range of about 0.05 micrometers to about 5 micrometers.

For example, the insulating layer 30 is made of one of silicon oxide, silicon nitride, and silicon oxynitride. These materials are commonly used in semiconductor manufacturing processes and have good process compatibility.

In an exemplary process, the insulating layer 30 can be formed by a chemical vapor deposition method.

Figure 3:
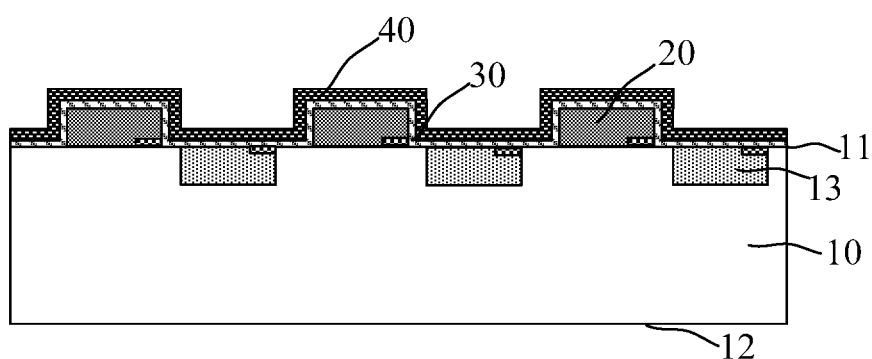

As shown in FIG. 3, the shielding layer 40 conformally covers the insulating layer 30.

The shielding layer 40 is used to reduce the interference of external magnetic fields on the devices in the integrated circuit, thereby improving the stability and reliability of the performance of the integrated circuit.

In one embodiment, the shielding layer 40 is an electrostatic shielding layer for terminating an external electric field on the surface of the shielding layer 40 and transmitting the charge to the ground. Correspondingly, the package structure formed in one embodiment connects the shielding layer 40 to the ground when in use.

In other embodiments, the shielding layer 40 may also be an electromagnetic shielding layer for reducing the influence of high frequency electromagnetic fields, so that the interference fields form eddy currents in the shielding layer 40, thereby weakening the field strength of the interference fields at position of the integrated circuit to achieve the shielding effect.

To achieve shielding effect, the material of the shielding layer 40 is a conductive material. For example, the shielding layer 40 includes one of a metal layer and an alloy layer.

For example, the shielding layer 40 is made of one or more of silver, copper, tin, aluminum, nickel, zinc, and tungsten. Alternatively, the shielding layer 40 may be an alloy of stainless steel and the like.

In an exemplary process, the shield layer 40 can be formed by one of a physical vapor deposition method and a sputtering method.

It should be noted that if the thickness of the shielding layer 40 is too large, the thickness and the volume of the formed package structure are easily increased; and if the thickness of the shielding layer 40 is too small, the shielding effect is easily affected and difficult to ensure the shielding effect of the shielding layer 40 on the external magnetic fields. Optionally, the shielding layer 40 has a thickness in a range of about 0.1 micrometers to about 10 micrometers.

Figure 4:
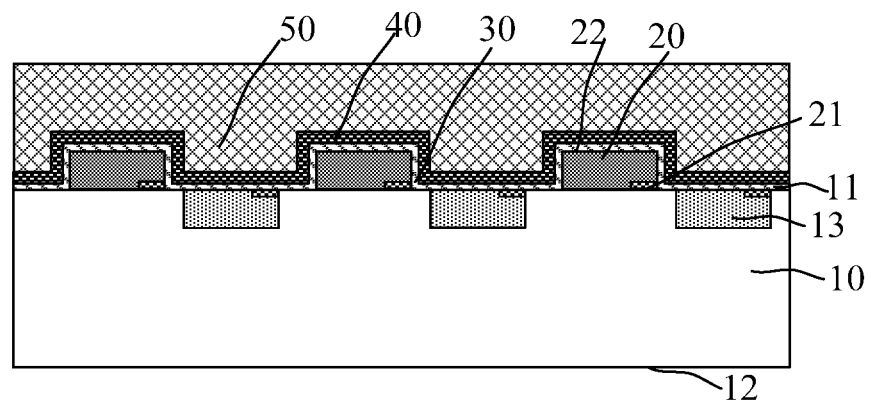

As shown in FIG. 4, an encapsulation layer 50 is formed on the shield layer 40.

The encapsulation layer 50 can function as an insulator, a seal, and a moisture barrier, and can reduce the probability that the plurality of first chips 20 is damaged, contaminated, or oxidized, thereby being beneficial to optimize the performance of the obtained package structure.

In one embodiment, exemplary steps of forming the encapsulation layer 50 include: forming the encapsulation layer 50 by an injection molding process. The filling performance of the injection molding process is better, and the encapsulation layer 50 can have good insulating and sealing effect on the plurality of first chips 20.

For example, the material of the encapsulation layer 50 is epoxy resin (Epoxy). Epoxy resin has advantages of low shrinkage, good adhesion, good corrosion resistance, excellent electrical properties and low cost, so it is widely used as an encapsulation material for electronic devices and integrated circuits. In other embodiments, the material of the encapsulation layer 50 may also be a thermosetting material such as one of polyimide and silica gel.

It should be noted that, in one embodiment, the shielding layer 40 is an electrostatic shielding layer and needs to be connected to the ground. Correspondingly, in the exemplary step of forming the encapsulation layer 50, the encapsulation layer 50 partially covers the shielding layer 40, thereby exposing a portion of the shielding layer 40. The shielding layer 40 exposed by the encapsulation layer 50 is a ground end which provides a basis for realizing the electrical connection between the shielding layer 40 and the ground.

Figure 4A:
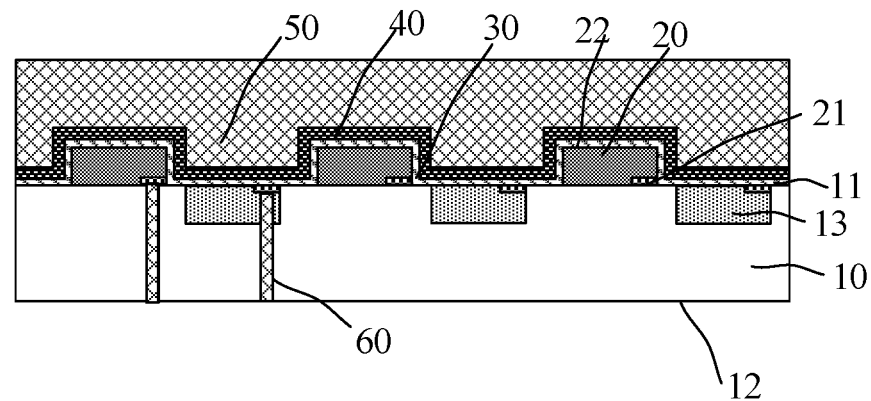

The wafer level packaging method of one embodiment further includes: for example, as shown in FIG. 4A, performing a wafer thinning treatment on the wafer back surface 12 of the device wafer 10 after forming the encapsulation layer 50; and forming through-silicon via (TSV) interconnect structures 60 in the thinned device wafer 10.

FIGS. 5-10 illustrate schematic cross-sectional views of structures corresponding to certain stages during another exemplary wafer level packaging method according to some embodiments of the present disclosure.

Compared with embodiments illustrated in FIGS. 1-4, FIGS. 5-10 at least illustrate a different method for forming an exemplary bonding structure, while similar/same structures and methods are not repeatedly described herein for the embodiments illustrated in FIGS. 5-10.

Figure 5:
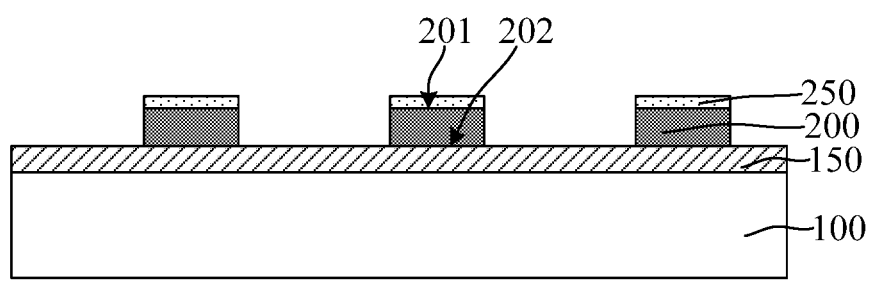
FIGS. 5-9 illustrate schematic cross-sectional views of structures corresponding to certain stages during another exemplary wafer level packaging method according to some embodiments of the present disclosure.

As shown in FIG. 5, exemplary steps of forming the bonding structure include: providing a plurality of first chips 200 having a plurality of first bonding layers 250 for implementing a bonding of the plurality of first chips 200 with a wafer to be integrated, which enables physical connection of the plurality of first chips 200 to the wafer to be integrated.

For example, the plurality of first bonding layers 250 is a first oxide layer as a bonding layer of a subsequent fusion bonding process.

In one embodiment, the material of the first oxide layer is silicon oxide. A silicon oxide material has high process compatibility, and silicon oxide is a commonly used and low cost material. Therefore, by selecting a silicon oxide material, the process difficulty and the process cost are reduced, and the impact to the performance of formed package structure is advantageously reduced. In other embodiments, the first oxide layer may also be one of ruthenium oxide, aluminum oxide, and ruthenium oxide.

A surface of the plurality of first chips 200 on which the plurality of first bonding layers 250 is formed is a chip front surface 201, and a surface opposite to the chip front surface 201 is a chip back surface 202. In addition, in one embodiment, exemplary steps of providing the plurality of first chips 200 include: providing a carrier wafer 100, with which the chip back surface 202 of the plurality of first chips 200 is temporarily bonded.

In one embodiment, the chip back surface 202 of the plurality of first chips 200 is temporarily bonded with the carrier wafer 100 via an adhesive layer 150.

For example, the adhesive layer 150 is one or both of a die attach film (DAF) and a dry film. The dry film is a viscous photoresist film used in the manufacture of a semiconductor chip package or a printed circuit board. The dry film is manufactured by coating a polyester substrate with a polyethylene film after the polyester substrate is coated with a solventless photoresist. During use, after the polyethylene film is removed, the solventless photoresist is pressed onto a substrate; therefore a pattern may be formed in the dry film by an exposure and development process.

In other embodiments, the plurality of second chips 200 may be temporarily bonded with the second wafer by an electrostatic bonding. Electrostatic bonding technology is a method of bonding without any adhesive. In this bonding process, second chips and second wafer to be bonded are respectively connected to different electrodes. Then surfaces of the second chips and the second wafer are charged under the action of voltage, and electrical properties of the surface charges of the second chips and the wafer are different, so that a large electrostatic attraction force is generated during the bonding process of the second chips and the second wafer to realize physical connection between the two.

Figure 6:
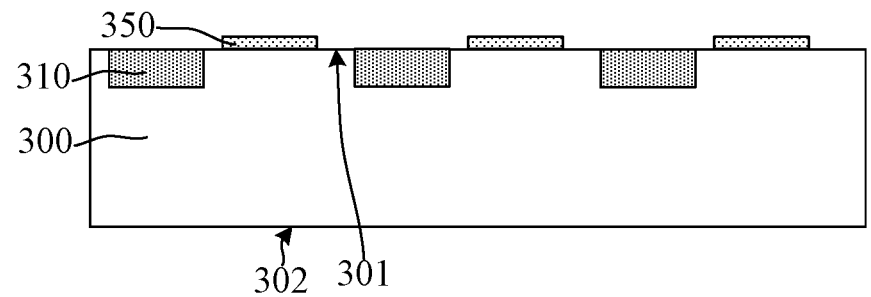

As shown in FIG. 6, a device wafer 300 is provided. A plurality of second bonding layers 350 is formed on a surface of the device wafer 300 for realizing physical connection between the device wafer 300 and the chips to be integrated.

A plurality of second chips 310 is formed in the device wafer 300. A surface of the device wafer 300 adjacent to the plurality of second chips 310 is a wafer front surface 301, and a surface opposite to the wafer front surface 301 is a wafer back surface 302. The plurality of second bonding layers 350 is formed on the wafer front surface 301 of the device wafer 300.

For example, the plurality of second bonding layers 350 is a second oxide layer as a bonding layer of a subsequent fusion bonding process.

In one embodiment, the material of the second oxide layer is silicon oxide. A silicon oxide material has high process compatibility, and silicon oxide is a commonly used and low cost material. Therefore, by selecting a silicon oxide material, the process difficulty and the process cost are reduced, and the impact to the performance of formed package structure is advantageously reduced. In other embodiments, the second oxide layer may also be made of one of ruthenium oxide, aluminum oxide, and ruthenium oxide.

The plurality of second bonding layers 350 is formed on the device wafer 300 between the plurality of second chips 310 in one embodiment. In other embodiments, the plurality of second bonding layers 350 may also be formed on the plurality of second chips 310.

Figure 7:
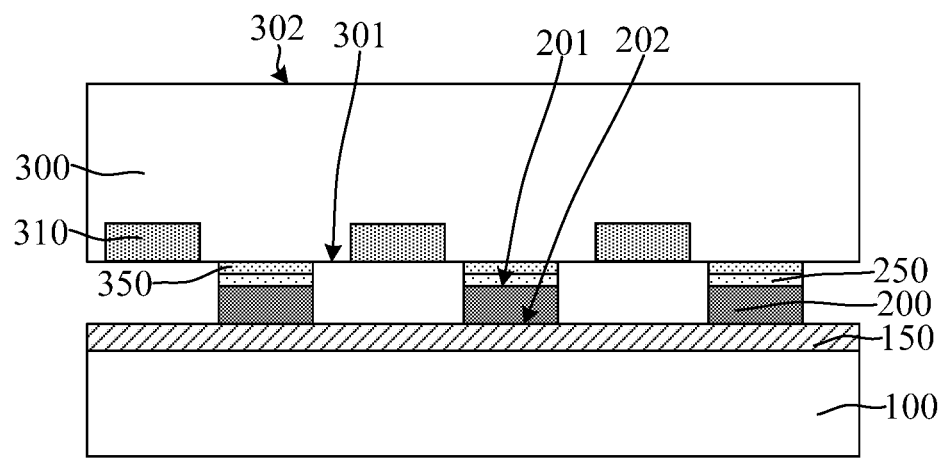

As shown in FIG. 7, the plurality of first bonding layers 250 and the plurality of second bonding layers 350 are aligned and bonded to bond the plurality of first chips 200 with the device wafer 300.

In one embodiment, the plurality of first bonding layers 250 is a first oxide layer, and the plurality of second bonding layers 350 is a second oxide layer. Correspondingly, the packaging method of one embodiment achieves a fusion bonding by the first oxide layer and the second oxide layer, thereby bonding the plurality of first chips 200 with the device wafer 300.

A fusion bonding is a process for accomplishing bonding mainly by using interface chemistry, during which surface activity of the first oxide layer and the second oxide layer is increased, thereby forming a covalent bond between contact surfaces of the oxide layer and the second oxide layer, and a bonding is achieved in a form of the covalent bond, thereby improving package reliability between the plurality of first chips 200 and the device wafer 300.

It should be noted that, in other embodiments, the plurality of first chips 200 and the device wafer 300 may also be bonded by other means, such as one of an adhesive bonding and a glass dielectric bonding.

For example, an adhesive bonding has a low bonding temperature and is compatible with CMOS devices. A wafer is adhesive-bonded in a heterogeneous integration process. For example, the adhesive bonding process includes: forming a binder on bonding surfaces of chips and a wafer, that the binder is usually a polymer; leaving the binder unpolymerized or partially polymerized by soft baking or pre-curing the polymer; and bringing the bonding surfaces of chips and the wafer into contact after the chips and the wafer are placed in a chamber and the chamber is vacuumed. The surfaces to be bonded are then tightly bonded by applying pressure.

A glass dielectric bonding refers to printing glass solder on a wafer to form closed loops, and then placing the printed wafer in a reflow oven for pre-sintering. The pre-sintered wafer is placed in alignment with chips, and the chips are placed in the closed loops. The pre-sintered wafer and the chips are then placed in a bonding machine for sintering to form sealed cavities. The glass dielectric bonding process is simple, has high bonding strength, has good sealing effect, and is especially suitable for mass production.

In addition, in one embodiment, the plurality of first chips 200 is temporarily bonded with a carrier wafer 100. The exemplary steps of bonding the plurality of first chips 200 with the device wafer 300 include: oppositely disposing the device wafer 300 with the carrier wafer 100; and aligning and bonding the plurality of first bonding layers 250 with the plurality of second bonding layers 350, thereby implementing the bonding between the plurality of first chips 200 and the device wafer 300.

In one embodiment, the plurality of first chips 200 is disposed on the carrier wafer 100. During the bonding process, the carrier wafer 100 can withstand a large bonding force, thereby enhancing the bonding strength between the plurality of first chips 200 and the device wafers 300.

Figure 8:
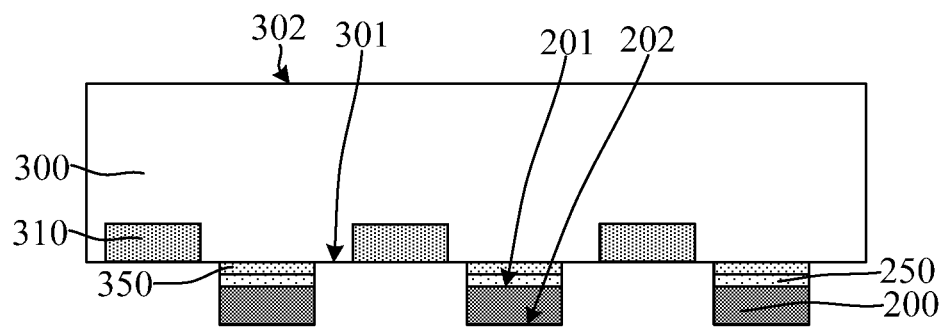

As shown in FIG. 8, the carrier wafer 100 (shown in FIG. 7) is unbonded to separate the carrier wafer 100 from the plurality of first chips 200.

By separating the carrier wafer 100 (shown in FIG. 7) from the plurality of first chips 200, the chip back surface 202 of the plurality of first chips 200 can be exposed.

In one embodiment, the plurality of first chips 200 is temporarily bonded to the carrier wafer 100 through an adhesive layer 150 (shown in FIG. 7). Accordingly, the exemplary steps of debonding include: separating the plurality of first chips 200 from the carrier wafer 100 by one of a chemical means and a mechanical peeling.

Figure 9:
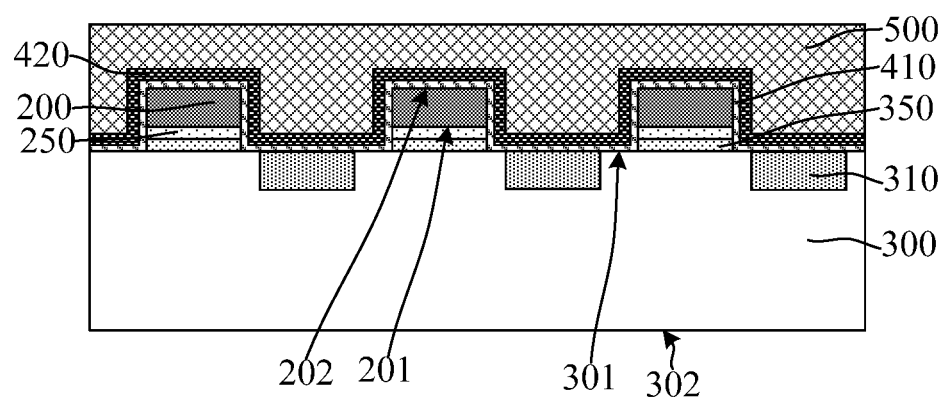

As shown in FIG. 9, after the bonding structure is provided, an insulating layer 410 and a shielding layer 420 sequentially conformally cover the bonding structure, and then an encapsulation layer 500 is formed on the shielding layer 420.

In one embodiment, the insulating layer 410 covers the chip back surface 202 and also covers the side surfaces of the plurality of first bonding layers 250 and the plurality of second bonding layers 350.

In the exemplary step of forming the bonding structure in one embodiment, the plurality of first chips 200 and the device wafer 300 have high bonding strength. Therefore, after the insulating layer 410 and the shielding layer 420 sequentially conformally cover the bonding structure, the package structure as a whole can maintain good reliability, thereby ensuring the anti-interference effect of the shielding layer 420 on the plurality of first chips 200 and the plurality of second chips 310 formed in the device wafer 300.

The method of forming the insulating layer 410, the shielding layer 420, and the encapsulating layer 500 is the same as that of the previous embodiments, and details are not described herein again.

The present disclosure also provides a wafer level package structure. Referring to FIG. 4, a schematic structural view of a wafer level package structure according to one exemplary embodiment of the present disclosure is shown.

The wafer level package structure includes: a device wafer 10; a plurality of first chips 20, bonded to the device wafer 10; an insulating layer 30, conformally covering the plurality of first chips 20 and the device wafer 10 exposed by the plurality of first chips 20; a shielding layer 40, conformally covering the insulating layer 30; and an encapsulation layer 50, formed on the shielding layer 40.

In the package structure of one embodiment, the bonding structure is conformally covered with the insulating layer 30, and the insulating layer 30 is also conformally covered with the shielding layer 40. The impact of external magnetic fields on the plurality of first chips 20 can be reduced by providing the shielding layer 40 on the bonding structure. In addition, the insulating layer 30 can insulate the shielding layer 40 from the plurality of first chips 20 and the device wafer 10, thereby avoiding the impact of the shielding layer 40 on the plurality of first chips 20 and the device wafer 10. The insulating layer 30 and the shielding layer 40 conformally cover the plurality of first chips 20 and the device wafer 10 exposed by the plurality of first chips 20, without excessively increasing and the volume and the thickness of the package structure. As such, while maintaining a small volume and a small thickness, the package structure is not susceptible to external magnetic fields.

The device wafer 10 is a wafer to be packaged that has been formed with devices. In some embodiments, the semiconductor substrate of the device wafer 10 is a silicon substrate. In other embodiments, the semiconductor substrate may be made by other materials, such as one of germanium, silicon germanium, silicon carbide, gallium arsenide, and/or indium gallium. In other embodiments, the semiconductor substrate can also be other types of substrates such as one of a silicon substrate on an insulator and a germanium substrate on an insulator. The material of the semiconductor substrate may be a material suitable for the needs of the semiconductor process or may be easy to integrate. The device wafer 10 has a thickness of about 10 micrometers to about 100 micrometers according to actual process requirements.

A plurality of second chips 13 has been formed in the device wafer 10. In one embodiment, the plurality of second chips 13 formed in the device wafer 10 may be the same type or different types of chips. The device wafer 10 can be fabricated by using an integrated circuit fabrication technique. For example, devices, such as N-Metal-Oxide-Semiconductor (NMOS) devices and P-Metal-Oxide-Semiconductor (PMOS) devices, may be formed on a first semiconductor substrate by processes such as a deposition, an etching, etc., such that at least one of the plurality of second chips 13 is integrated in the device wafer 10.

For example, a surface of the device wafer 10 on which the plurality of second chips 13 is formed is a wafer front surface 11, and a surface opposite to the wafer front surface 11 is a wafer back surface 12. The plurality of first chips 20 is bonded to the wafer front surface 11 of the wafer 10.

The plurality of first chips 20 bonded to the device wafer 10 is used as chips to be integrated in a wafer-level system-in-package (WLSiP).

The wafer level package structure according to one embodiment of the present disclosure is heterogeneous integration. Correspondingly, the plurality of first chips 20 may be chips made of silicon wafers, or may be chips formed of other materials.

The number of the plurality of first chips 20 is at least one. When the number of the plurality of first chips 20 is two or more, the functions of the plurality of first chips 20 are different. The plurality of first chips 20 can be fabricated by using an integrated circuit fabrication technology, and can be memory chips, communication chips, processors, or logic chips. The plurality of first chips 20 includes devices such as NMOS devices or PMOS devices formed on a semiconductor substrate.

For example, lead pads formed in the plurality of first chips 20 are used to implement electrical connection of the plurality of first chips 20. A surface of the plurality of first chips 20 adjacent to the lead pads is a chip front surface 21, and a surface opposite to the chip front surface 21 is a chip back surface 22. In one embodiment, the chip front surface 21 of the plurality of first chips 20 is bonded to the wafer front surface 11 of the device wafer 10. The bonding can be a fusion bonding, an adhesive bonding, a glass dielectric bonding, etc.

In a fusion bonding, the surface activity of the chip front surface 21 of the plurality of first chips 20 and the wafer front surface 11 of the device wafer 10 is increased. A covalent bond is formed between the chip front surface 21 and the wafer front surface 11, a bonding is formed in a form of the covalent bond, and there is high bonding strength between the chip front surface 21 and the wafer front surface 11, thereby improving reliability of the wafer level package structure of this embodiment.

In other embodiments, first chips may also be bonded to a first wafer by one of an adhesive bonding and a glass dielectric bonding.

For example, an adhesive bonding has a low bonding temperature and is compatible with CMOS devices. A wafer is adhesive-bonded in a heterogeneous integration process. For example, the adhesive bonding process includes: forming a binder on bonding surfaces of chips and a wafer, that the binder is usually a polymer; leaving the binder unpolymerized or partially polymerized by soft baking or pre-curing the polymer; and bringing the bonding surfaces of the chips and the wafer into contact after the chips and the wafer are placed in a chamber and the chamber is vacuumed. The surfaces to be bonded are then tightly bonded by applying pressure.

A glass dielectric bonding refers to printing glass solder on a wafer to form closed loops, and then placing the printed wafer in a reflow oven for pre-sintering. The pre-sintered wafer is placed in alignment with chips, and the chips are placed in the closed loops. The pre-sintered wafer and the chips are then placed in a bonding machine for sintering to form sealed cavities. The glass dielectric bonding process is simple, has high bonding strength, has good sealing effect, and is especially suitable for mass production.

In one embodiment, the plurality of first chips 20 bonded to the device wafer 10 and the plurality of second chips 13 formed in the device wafer 10 are staggered from each other, that is, the projection of the plurality of first chips 20 on the device wafer 10 does not coincide with the plurality of second chips 13.

In other embodiments, a plurality of first chips bonded to the device wafer and a plurality of second chips in the device wafer may also be aligned with each other. That is, the projection of the plurality of first chips on the device wafer coincides with the plurality of second chips.

The insulating layer 30 conformally covers the plurality of first chips 20 and the device wafer 10 exposed by the plurality of first chips 20. Because the shielding layer 40 is generally a conductive material, the insulating layer 30 is used to achieve electrical insulation between the shielding layer 40 and the plurality of first chips 20, and between the shielding layer 40 and the device wafer 10, thereby avoiding impact of the shielding layer 40 on the package structure performance.

In one embodiment, the insulating layer 30 covers a chip back surface of the plurality of first chips 20 and a wafer front surface of the device wafer 10.

In one embodiment, the insulating layer 30 conformally covers the plurality of first chips 20 and the device wafer 10 exposed by the plurality of first chips 20, that is, the thickness of the insulating layer 30 is relatively small, which is advantageous for reducing the thickness and the volume of the package structure.

It should be noted that if the thickness of the insulating layer 30 is too large, the thickness and the volume of the formed package structure are easily increased; and if the thickness of the insulating layer 30 is too small, the insulating effect of the insulating layer 30 is easily affected. Optionally, the insulating layer 30 has a thickness in a range of about 0.05 micrometers to about 5 micrometers.

For example, the insulating layer 30 is made of one of silicon oxide, silicon nitride, and silicon oxynitride. These materials are commonly used in semiconductor manufacturing processes and have good process compatibility.

The shielding layer 40 conformally covers the insulating layer 30 to reduce interference of external magnetic fields on devices in the integrated circuit, thereby improving stability and reliability of integrated circuit performance.

In one embodiment, the shielding layer 40 is an electrostatic shielding layer for terminating external electric fields on the surface of the shielding layer 40 and transmitting the charge to the ground.

In other embodiments, the shielding layer 40 may also be an electromagnetic shielding layer for reducing the influence of high frequency electromagnetic fields, so that the interference fields form eddy currents in the shielding layer 40, thereby weakening the field strength of the interference fields at position of the integrated circuit to achieve the shielding effect.

In order to achieve the shielding effect, the material of the shielding layer 40 is a conductive material. For example, the shielding layer 40 includes one of a metal layer and an alloy layer.

For example, the shielding layer 40 is made of one or more of silver, copper, tin, aluminum, nickel, zinc, and tungsten. The shielding layer 40 may also be an alloy such as stainless steel and the like.

It should be noted that if the thickness of the shielding layer 40 is too large, the thickness and the volume of the formed package structure are easily increased; and if the thickness of the shielding layer 40 is too small, the shielding effect is easily affected, and it is difficult to ensure the shielding effect on the external the magnetic field. Optionally, the shielding layer 40 has a thickness in a range of about 0.1 micrometers to about 10 micrometers.

An encapsulation layer 50 formed on the shielding layer 40 can function as an insulator, a seal, and a moisture barrier, and can reduce the probability that the plurality of first chips 20 is damaged, contaminated, or oxidized, thereby facilitating optimization of the performance of the obtained package structure.

The encapsulation layer 50 is an injection molding layer, and the injection molding layer is located on the shielding layer 40 and filled between the plurality of first chips 20. The filling performance of the injection molding process can better achieve good insulation and sealing effect between the plurality of first chips.

For example, the material of the encapsulation layer 50 is epoxy resin (Epoxy). Epoxy resin has the advantages of low shrinkage, good adhesion, good corrosion resistance, excellent electrical properties and low cost, so it is widely used as a packaging material for electronic devices and integrated circuits. In other embodiments, the material of the encapsulation layer 50 may also be a thermosetting material such as one of polyimide and silica gel.

It should be noted that, in one embodiment, the shielding layer 40 is an electrostatic shielding layer and needs to be connected to the ground. The encapsulation layer 50 partially covers the shielding layer 40 to expose a portion of the shielding layer 40. The shielding layer exposed by the encapsulation layer is a ground end for connecting to the ground.

In the package structure of the embodiment, the device wafer 10 is a wafer after the wafer is thinned, and the thinned wafer is further formed with through-silicon via (TSV) interconnect structures (not shown), which is not detailed herein.

Referring to FIG. 9, a schematic structural view of a wafer level package structure according to another exemplary embodiment of the present disclosure is shown. Compared with one exemplary embodiment illustrated in FIG. 4, FIG. 9 at least illustrates a different package structure, while similar/same structures are not repeatedly described herein for the exemplary embodiment illustrated in FIG. 9.

A plurality of second bonding layers 350 is formed on a surface of a device wafer 300 for realizing physical connection of the device wafer 300 with the chips to be integrated.

A plurality of second chips 310 has been formed in the device wafer 300. A surface of the device wafer 300 adjacent to the plurality of second chips 310 is a wafer front surface 301, and a surface opposite to the wafer front surface 301 is a wafer back surface 302. The plurality of second bonding layers 350 is formed on the wafer front surface 301 of the device wafer 300.

For example, the plurality of second bonding layers 350 is a second oxide layer for achieving a bonding layer in a fusion bonding.

In one embodiment, the material of the second oxide layer is silicon oxide. A silicon oxide material has high process compatibility, and silicon oxide is a commonly used and low cost material. Therefore, by selecting a silicon oxide material, the process difficulty and the process cost are reduced, and the impact to the performance of formed package structure is advantageously reduced.

The plurality of second bonding layers 350 is formed on the device wafer 300 between the plurality of second chips 310 in one embodiment. In other embodiments, the plurality of second bonding layers 350 may also be formed on a surface of the plurality of second chips 310.

In the package structure of one embodiment, a plurality of first bonding layers 250 is formed on a surface of a plurality of first chips 200 facing the device wafer 300. The plurality of first bonding layers 250 is aligned and bonded with the plurality of second bonding layers 350. For example, the plurality of first bonding layers 250 is a first oxide layer for a fusion bonding with the plurality of second bonding layers 350.

In one embodiment, the plurality of first chips 200 and the device wafer 300 have high bonding strength. Accordingly, the package structure as a whole can maintain good package reliability, thereby ensuring that the anti-interference effect of the shielding layer 420 to the plurality of first chips 200 and the plurality of second chips 310 formed in the device wafer 300.

The technical solution according to the present disclosure has the following advantages.

The insulating layer conformally covers the plurality of first chips and the device wafer exposed by the plurality of first chips. The shielding layer conformally covers the insulating layer. Providing the shielding layer on the bonding structure can reduce the influence of external magnetic fields on the plurality of first chips. Further, the insulating layer may be used to isolate the shielding layer from the plurality of first chips and the device wafer, thereby avoiding the influence of the shielding layer on the electrical performance of the plurality of first chips and the device wafer. In the present disclosure, the insulating layer and the shielding layer are formed to conformally cover the bonding structure without excessively increasing the volume and the thickness of the package structure. As such, while maintaining a small volume and a small thickness, the package structure is not susceptible to external magnetic fields.

Although the present disclosure has been disclosed above, the present disclosure is not limited thereto. Any changes and modifications may be made by those skilled in the art without departing from the spirit and scope of the disclosure, and the scope of the disclosure should be determined by the scope of the claims.

What is claimed is:

1. A wafer level packaging method, comprising:
   forming a bonding structure, wherein the bonding structure comprises a device wafer and a plurality of first chips bonded to the device wafer, the device wafer includes a plurality of second chips in the device wafer, the plurality of first chips and the plurality of second chips are located on a surface of the device wafer, and a projection of the plurality of second chips on the surface of the device wafer has no overlap with a projection of the plurality of first chips on the surface of the device wafer;
   forming an insulating layer directly on the device wafer and the plurality of first chips, conformally covering the plurality of first chips and the device wafer exposed by the plurality of first chips with the insulating layer;
   conformally covering the insulating layer with a shielding layer; and
   forming an encapsulation layer on the shielding layer.

2. The method according to claim 1, wherein the shielding layer includes one of a metal layer and an alloy layer, and the shielding layer is made of one or more of silver, copper, tin, aluminum, nickel, zinc, and tungsten.

3. The method according to claim 1, further comprising:
   after forming the encapsulation layer, performing a wafer thinning treatment on a surface of the device wafer away from the plurality of first chips; and
   forming through-silicon via (TSV) interconnect structures through the thinned device wafer.

4. The method according to claim 1, wherein the shielding layer is formed by one of a physical vapor deposition method and a sputtering method.

5. The method according to claim 1, wherein the shielding layer has a thickness in a range of about 0.1 micrometers to about 10 micrometers.

6. The method according to claim 1, wherein the insulating layer is made of one of silicon oxide, silicon nitride, and silicon oxynitride.

7. The method according to claim 1, wherein the insulating layer is formed by a chemical vapor deposition method.

8. The method according to claim 1, wherein the insulating layer has a thickness in a range of about 0.05 micrometers to about 5 micrometers.

9. The method according to claim 1, wherein the encapsulation layer is formed by an injection molding process.

10. The method according to claim 1, wherein:
    a top surface of each of the plurality of second chips is coplanar with the surface of the device wafer; and
    the insulation is further directly on the top surface of the each of the plurality of second chips;
    the shielding layer is an electrostatic shielding layer, and forming the encapsulation layer includes:
       partially covering the shielding layer with the encapsulation layer, thereby exposing a portion of the shielding layer as a ground end.

11. The method according to claim 1, wherein forming the bonding structure includes:
    providing the plurality of first chips having a plurality of first bonding layers formed on the plurality of first chips;
    providing the device wafer having a plurality of second bonding layers formed on the surface of the device wafer; and
    aligning and bonding the plurality of first bonding layers with the plurality of second bonding layers to bond the plurality of first chips with the device wafer.

12. The method according to claim 11, wherein:
    a surface of the plurality of first chips formed with the plurality of first bonding layers is a chip front surface, and a surface opposite to the chip front surface is a chip back surface;
    before aligning and bonding the plurality of first bonding layers with the plurality of second bonding layers, the chip back surface of the plurality of first chips is temporarily bonded to a carrier wafer; and
    the carrier wafer is debonded prior to conformally covering the plurality of first chips and the device wafer exposed by the plurality of first chips with the insulating layer.

13. A wafer level package structure, comprising:
    a device wafer;
    a plurality of first chips, bonded to the device wafer, wherein the device wafer includes a plurality of second chips in the device wafer, the plurality of first chips and the plurality of second chips are located on a surface of the device wafer, and a projection of the plurality of second chips on the surface of the device wafer has no overlap with a projection of the plurality of first chips on the surface of the device wafer;
    an insulating layer directly on the device wafer and the plurality of first chips, conformally covering the plurality of first chips and the device wafer exposed by the plurality of first chips;
    a shielding layer, conformally covering the insulating layer; and
    an encapsulation layer, formed on the shielding layer.

14. The structure according to claim 13, wherein:
    the shielding layer includes one of a metal layer and an alloy layer, wherein;
    a top surface of each of the plurality of second chips is coplanar with the surface of the device wafer; and
    the insulation is further directly on the top surface of the each of the plurality of second chips.

15. The structure according to claim 13, wherein the shielding layer has a thickness in a range of about 0.1 micrometers to about 10 micrometers.

16. The structure according to claim 13, wherein the insulating layer is made of one of silicon oxide, silicon nitride, and silicon oxynitride.

17. The structure according to claim 13, wherein the insulating layer has a thickness in a range of about 0.05 micrometers to about 5 micrometers.

18. The structure according to claim 13, wherein the encapsulation layer is an injection molded layer.

19. The structure according to claim 13, wherein the encapsulation layer partially covers the shielding layer, thereby exposing a portion of the shielding layer as a ground end.

20. The structure according to claim 13, wherein:
a plurality of first bonding layers is formed on the plurality of first chips;
a plurality of second layers is formed on the surface of the device wafer; and
the plurality of second layers is aligned and bonded with the plurality of first bonding layers.

* * * * *